United States Patent
Yankov

(10) Patent No.: US 8,085,821 B2
(45) Date of Patent: Dec. 27, 2011

(54) LIGHT-ENHANCING DEVICE AND METHOD BASED ON USE OF AN OPTICALLY ACTIVE LASING MEDIUM IN COMBINATION WITH DIGITAL PLANAR HOLOGRAPHY

(76) Inventor: Vladimir Yankov, Washington Township, NJ (US)

( * ) Notice: Subject to any disclaimer, the term of this patent is extended or adjusted under 35 U.S.C. 154(b) by 10 days.

(21) Appl. No.: 12/592,191

(22) Filed: Nov. 23, 2009

(65) Prior Publication Data

US 2011/0122468 A1 May 26, 2011

(51) Int. Cl.
*H01S 3/098* (2006.01)
(52) U.S. Cl. ............................................. 372/19; 372/20
(58) Field of Classification Search .................. 372/19, 372/20
See application file for complete search history.

(56) References Cited

U.S. PATENT DOCUMENTS

| | | | |
|---|---|---|---|
| 6,744,791 B2 * | 6/2004 | McAlexander et al. | 372/20 |
| 7,382,808 B1 * | 6/2008 | Efimov | 372/19 |
| 2003/0039444 A1 | 2/2003 | Mossberg et al. | |
| 2003/0117677 A1 | 6/2003 | Mossberg et al. | |
| 2004/0170356 A1 * | 9/2004 | Iazikov et al. | 385/37 |
| 2006/0126992 A1 | 6/2006 | Hashimoto et al. | |
| 2006/0233493 A1 | 10/2006 | Mossberg et al. | |
| 2007/0034730 A1 | 2/2007 | Mossberg et al. | |
| 2007/0053635 A1 | 3/2007 | Iazikov et al. | |
| 2009/0190195 A1 | 7/2009 | Yankov | |
| 2009/0195778 A1 | 8/2009 | Yankov | |

FOREIGN PATENT DOCUMENTS

EP  0864892 (A2)  9/1998

OTHER PUBLICATIONS

U.S. Appl. No. 12/584,891, filed 2009, V. Yankov.
Article "Digital Planar Holography and multiplexer/demultiplexer with discrete dispersion" of V. Yankov, et al. in SPIE proceedings series (Conference Active and passive optical components for WDM communications III : ( Orlando FL, Sep. 8-11, 2003 )).
Article "Digital optical spectrometer-on-chip" published in Appl. Phys. Lett. 95, 041105 (2009); by S. Babin, et al.

* cited by examiner

*Primary Examiner* — Kinam Park

(57) ABSTRACT

The light-enhancing system of the invention comprises a laser diode in which a fully reflecting mirror and/or a partially reflecting mirror of the laser diode is made in the form of digital planar holography (DPH) incorporating a mode-reorganization function that decreases divergence and improves brightness of the output beam of the system by suppressing high-order modes and gaining low-order modes, or mode. The holographic elements are made in the form of rectangular grooves that can be manufactured as binary features reproduced by methods of nanolithography or nanoimprinting.

20 Claims, 11 Drawing Sheets

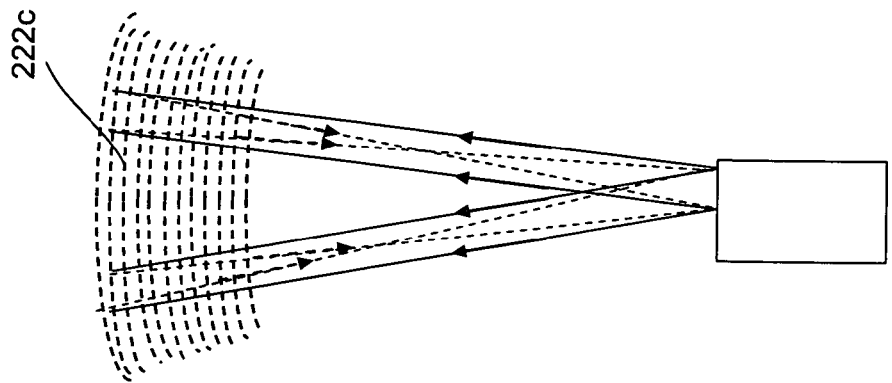
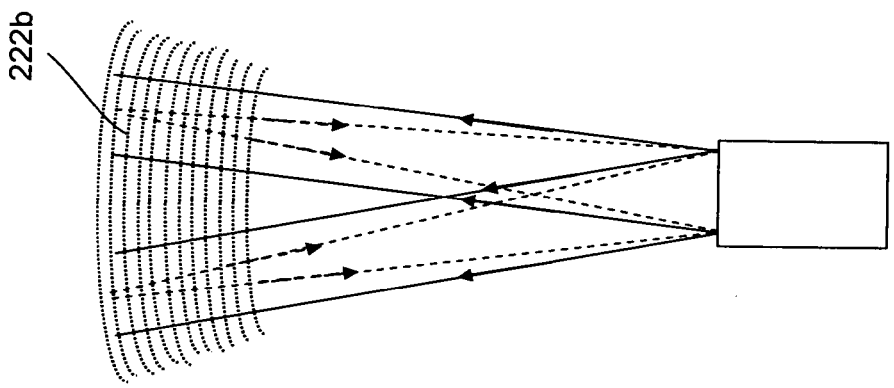
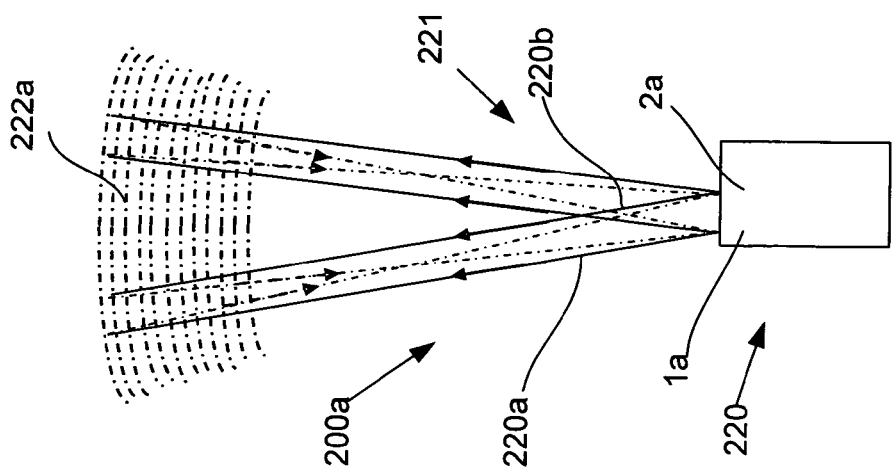

LIGHT-ENHANCING DEVICE AND METHOD BASED ON USE OF AN OPTICALLY ACTIVE LASING MEDIUM IN COMBINATION WITH DIGITAL PLANAR HOLOGRAPHY

FIELD OF THE INVENTION

The present invention relates to a light-enhancing device and a method based on the use of laser diodes in combination with digital planar holography. More specifically, the invention relates to a light-enhancing device and a method based on the use of a multimode laser diode in combination with digital planar holography to reduce the number of modes with a resulting decrease in divergence, without a noticeable loss of optical light power, and with a resulting improvement of brightness. The device may find use for transmitting light between various optical systems and for improving brightness of the output beam emitted from the system. The device may also be used as a source of light that has high intensity even in far-field regions.

BACKGROUND OF THE INVENTION

One of the problems that currently exists in the field of laser technology is insufficient quality of radiation from edge-emitting laser diodes. It is known that light beams emitted from edge-emitting laser diodes have a complicated structure. These beams are asymmetric and exhibit different divergences in the emitter plane (slow axis) and in the plane perpendicular to the emitter plane (fast axis). Although fast-axis divergence is much greater, the wavefront is close to a diffraction-limited spherical shape, and the beam can be easily collimated with a spherical lens. On the other hand, the slow-axis beam structure can be very complicated, and collimation is very difficult, if even possible.

The radiation structure of the aforementioned type significantly complicates formation of desired beams and their collimation and focusing on a target, as well as coupling into optical fibers. A common solution to the above problem demands the use of anamorphous optics, such as special collimators for fast and slow axes, special focusing optics, etc. However, precision collimators of this type are expensive, and this limits their use in practice. Designs of collimators for beams propagated in the direction of slow and fast axes are known and described in numerous patents, for example, U.S. Pat. Nos. 4,687,285; 5,940,564; 6,031,953; and European Patent EP No. 864,892.

It is understood that the above problem is even greater for laser diodes with wide emitters, i.e., with emitters having a high ratio of emitter width to emitter height. The driving force behind widening the emitter area is the desire to increase output power without damaging the output face of the laser diode. An example of such laser diodes that recently appeared on the market is a device having an emitter width greater than 100 microns (slow axis) and a height of less than 1.5 microns (fast axis). The output power of these diodes exceeds several watts and may reach tens of watts, and the structure of their radiation has a complicated multimode nature that leads to high divergence of the output beam. Conventional approaches to the solution of the above problem with respect to the wide-aperture edge-emitting laser diodes do not allow for forming single transverse mode beams without significant loss of power and increase in weight or size. Therefore, advantages inherent in optical laser devices are not used to their full potentials for wide-aperture edge-emitting laser diodes.

In view of the above, the problem of improving optical characteristics such as mode composition, beam divergence in the direction of slow and fast axes without noticeable reduction in optical power, and, hence, brightness, is an extremely important task in laser technology.

An innovative method of controlling the optical parameters of a light beam such as direction of light propagation, change of phases, spectral dispersion, etc., as proposed in U.S. patent application Ser. No. 12/011,453 filed Jan. 28, 2008, is the use of planar optical waveguides with quasi continuous change in the refractive index. This approach is known as digital planar holography (DPH), a new technology recently developed for fabricating miniature components for integrated optics. The essence of DPH technology is the embedding of digital holograms calculated by a computer inside a planar waveguide.

The DPH allows for light propagation in the hologram plane rather than in the perpendicular direction and results in a long interaction path. Benefits of a long interaction path are well known for volume/thick holograms. On the other hand, planar configuration provides easy access to the surface, where the hologram should be embedded, enabling a simple fabrication process.

As known, light is confined in waveguides by a refractive index gradient and propagates in a core layer surrounded with a cladding layer. Materials for core/cladding layers should be selected so that the core refractive index $N_{core}$ is greater than that of the cladding layer $N_{clad}$: $N_{core} > N_{clad}$. Cylindrical waveguides (optical fibers) allow for one-dimensional light propagation along the axis. Planar waveguides, which are fabricated by sequentially depositing flat layers of transparent materials with a proper refractive index gradient on a standard wafer, confine light in one direction (axis z) and permit free propagation in two other directions (axes x and y).

A lightwave propagating through the waveguide core extends to some degree into both cladding layers. If the refractive index is modulated in the wave path, the light from each given wavelength can be directed to a desirable point.

DPH technology can be used for designing and fabricating holographic nanostructures inside a planar waveguide, thus providing conditions for light processing and control. There are several ways of modulating the core refractive index, the simplest of which is engraving the required pattern by means of nanolithography. Modulation is created by embedding a digital hologram on one of the core/cladding interfaces or on both of them. Standard lithographical processes can be used, making mass production straightforward and inexpensive. Nanoimprinting is another viable method for fabricating DPH patterns. Each DPH pattern is computer-generated and is customized for a given application. The consists of numerous nanogrooves, each ~100 nm wide, positioned so as to provide maximum efficiency for a specific application.

The devices are fabricated on standard wafers. While the total number of nanogrooves is huge ($=10^6$), the typical size of DPH devices is on a scale of millimeters.

DPH structure can be described as a digital planar hologram that comprises an optimized combination of overlaid virtual subgratings, each of which is resonant to a single wavelength of light.

SUMMARY

The light-enhancing device of the invention comprises a lasing medium installed on a substrate sub mount made, e.g., of silica, and a DPH mode reorganizer, which is formed on a standard wafer substrate according to specific application of the device. Both units are supported by a mounting plate that also can be made of a suitable material of high thermal conductivity, such as ceramic having high thermal conductivity.

The optically active lasing medium (wide-aperture emitter) radiates a multimode light beam. In this context "wide-aperture" means that its width ranges from 10 microns to several hundred microns. The height of the emitter ranges from 0.2 nm to several microns. The active lasing medium is limited on one side with a fully reflective mirror and on the other side with antireflective coating having a very low reflection coefficient (R<0.1%).

The DPH mode reorganizer is supported by a silicon substrate and comprises a cladding layer that rests on the silicon substrate and comprises the following: (1) a layer of a lower cladding of $SiO_2$ having a thickness ranging from several to several tens of microns; and (2) a core placed onto the lower cladding that is made of silicon doped with a material such as germanium, which increases the core refractive index, and having a thickness of several nanometers to one micron. The upper cladding and core have different refraction indices that differ by 1 to 5%. In other words, the refraction index of the core is greater than that of the cladding. If necessary, an upper cladding can be deposited onto the core.

The core of the DPH unit comprises a plurality of holographic elements (hereinafter referred to as "elements") that can be produced in the form of grooves with a depth less than the thickness of the core. Preferably, the holographic elements are manufactured as rectangular grooves reproduced by methods of binary nanolithography. The number of such elements can exceed $10^6$. The total surface area occupied by these elements on the surface of the core is several $mm^2$. The elements locally change the refractive indices of the core. It is understood that if the dimensions of the elements do not exceed half of a light wavelength, the density of the elements on the core surface can be used for controlling propagation of the light beam. This means that the light beam emitted from the lasing medium can be converted, after passing through and processing inside the DPH unit, into a beam of desired parameters defined by the DPH structure and configuration.

Both the lasing medium and the DPH mode reorganizer can be mounted on a common base plate made, e.g., of Si, $SiO_2$, or quartz. To stabilize temperature in lasing media of high power, the common base plate can be made from a material of high thermal conductivity on a thermoelectric cooler. The lasing medium and the DPH mode reorganizer are mounted on the base plate so that the optical axis of the lasing medium is aligned with the optical axis of the core and the respective axis of the hologram, e.g., the symmetry axis.

In a conventional wide-aperture lasing medium without use of the above-described DPH mode reorganizer, the output beam will have a multimode nature that consists of several tens or even hundreds of various transverse lateral modes of various intensities.

The picture dramatically changes when the lasing medium is optically coupled with the specific DPH mode reorganizer of the invention because the DPH mode reorganizer decreases the number of modes to one, two, or three. As a result, a powerful low-order mode is formed, and the major part of the power output of the laser is concentrated in this low-order mode, while a much smaller part of the laser power is held by the remaining side modes, the total number of which is significantly reduced to one, two, or three. This mode distribution pattern is typical for the far field. Angular divergence in the direction of the slow axis can be reduced in order of magnitude, e.g., from 20° to 2°.

It was unexpectedly discovered that with use of the DHP-mode reorganizer in the present invention, divergence in the direction of the fast axis was also reduced, in this case by a factor of 4, i.e., from approximately 40° to 10°. Also, it was discovered that the beam that was collimated in the core during propagation through the DPH mode reorganizer was then transferred to the lower cladding, at which point it was sent from the system.

BRIEF DESCRIPTION OF THE DRAWINGS

FIGS. 2A, 2B, 2C, 2D, 2E, and 2F are simplified schematic top views of the mode-reorganizing system according to the invention that illustrates interaction of the selected modes of the laser with respective subgratings, which, in reality, are combined into a single supergrating.

DETAILED DESCRIPTION OF THE INVENTION

Terminology used in the present specification is explained below. In the context of the present patent specification, the term "lasing medium" relates to a part of a laser type of light-emitting device, such as a laser diode, that forms the aforementioned device in combination with respective fully reflecting and/or partially reflecting mirrors.

Furthermore, although mode structures are considered in general, all of the modifications considered below relate to lateral modes. Some important properties of laser diodes depend on the geometry of the optical cavity. Thus, in the vertical direction, light is contained in a very thin layer, and, therefore, structure supports only a single optical mode in the direction perpendicular to the layers. However, in the lateral direction, if the waveguide is wide when compared to the wavelength of light, then the waveguide can support multiple lateral optical modes, and the laser is known as "multimode."

Figure 1:
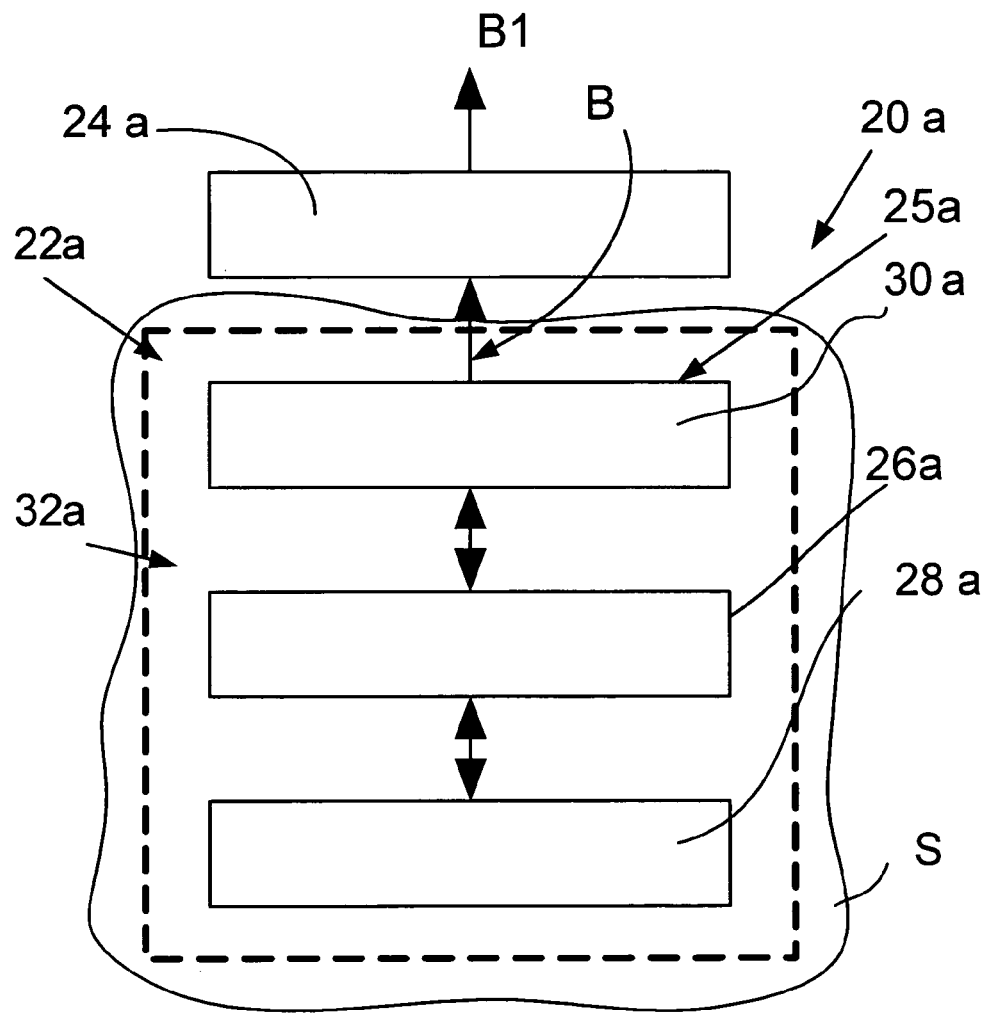
FIG. 1A is a block diagram of a conventional optical system with a multimode lasing medium and with collimating optics.
FIG. 1B is a block diagram of the mode-reorganizing optical system of the invention, wherein the DPH mode reorganizer is located between the laser-active medium and the output optics and is used as a partially reflecting mirror.
FIG. 1C is a block diagram of the mode-reorganizing optical system of the invention, wherein the DPH mode reorganizer functions as a fully reflecting mirror and is located at the closed end of the resonator.

FIG. 1A is a block diagram of a conventional optical system 20a with a multimode wide-aperture laser diode 22a and with collimating optics 24a. The multimode laser diode 22a comprises a lasing medium 26a and is located between a partially reflecting output mirror 30a and a fully reflecting mirror 28a. In the structure of the multimode laser diode 22a, the mirrors 28*a* and 30*a* form an optical resonator 32*a*. Reference numeral 25*a* designates an emitter of the laser diode 22*a* located on the outer side of the partially reflecting mirror 30*a*. All of these parts are mounted on a submount S. In the resonator 32*a*, the light applied from the laser-active medium 26*a* bounces back and forth between the mirrors 28*a* and 30*a*, enhancing stimulated emission. The beam B that is sent from the laser diode 22*a* is collimated by the optics 24*a*, thus producing a collimated output beam B1 (FIG. 1A).

The system 20*a* described above and shown in FIG. 1A is a well-known structure used in a lasing medium technique. The inventor herein has found that in addition to light reflection, one or both mirrors 28*a* and/or 30*a* can impart to the system 20*a* a new function, i.e., the function of an optical-mode reorganizer, which provides intercoupling of all modes of the beam of a lasing medium 26*a* in order to stabilize the radiating wavelength, to synchronize phases, and to reorganize mode structure by suppressing the high-order modes and gaining the low-order modes with lower divergence or even a single mode with the lowest divergence, thus increasing brightness of the output beam B.

Figure 1B:
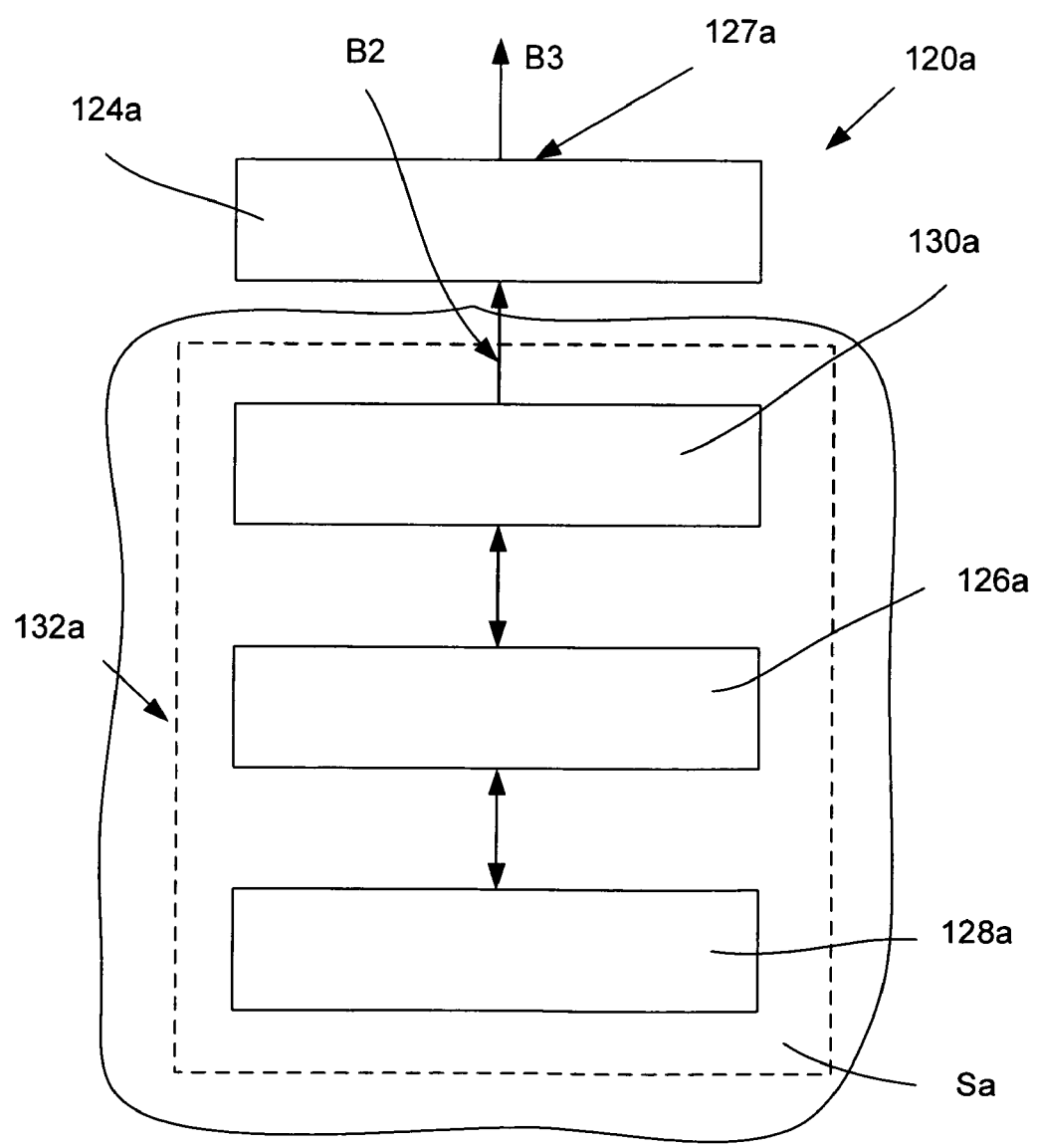

Furthermore, according to the invention, system components used to accomplish the aforementioned beam-reorganizing function and other functions can be embodied as DPH optical components formed as digital holograms generated in a computer and embedded into planar waveguides by standard mass-production methods, such as binary nanolithography or nanoimprinting. As a result, a mode-reorganizing system 120*a* of the type shown in FIG. 1B is obtained. In the context of the present invention, the term "mode-reorganizing system" covers an assembly comprising an optically active lasing medium, a planar waveguide that contains a DPH mode reorganizer, and at least one mirror (fully or partially reflecting).

In the mode-reorganizing system 120*a* of the invention, the mode-reorganized optical-beam components that are similar to those shown in FIG. 1A are designated by the same reference numerals with the addition of 100. For example, the system 120*a* comprises a lasing medium 126*a* and an output optical unit 124*a* that manages the beam B2 emitted from the lasing medium 126*a* and produces the output beam B3 (FIG. 1B) from an output end 127*a* of the system. In distinction from the conventional system 20*a* of FIG. 1A, the system 120*a* incorporates a mode reorganizer 130*a* made in the form of a DPH device, hereinafter referred to as "DPH mode reorganizer." The lasing medium 126*a* is placed on the same basic support plate Sa on which the DPH mode reorganizer 130*a* that accomplishes the aforementioned new functions (i.e., the functions of reorganizing modes of the multimode laser) is placed in order to narrow the radiating space spectrum, to improve synchronization of the mode phases of all modes, and to reorganize the modes so that the side modes are suppressed while the low-order modes, or mode, are gained. In other words, after integration on a support plate Sa, the laser-active medium 126*a* and the DPH mode reorganizer 130*a* form a single optical chip. Optical coupling and interaction between the lasing medium 126*a* and the DPH mode reorganizer 130*a* is carried out through a well-known method of optical butt connection between two laser media.

The system 120*a* also incorporates a fully reflecting mirror 128*a*. The lasing medium 126*a*, the DPH mode reorganizer 130*a*, and the fully reflecting mirror 128*a* form an optical resonator 132*a*. In the resonator 132*a*, the light applied from the laser-active medium 126*a* bounces back and forth between the DPH mode reorganizer 130*a* and the fully reflecting mirror 128*a*, thereby enhancing stimulated emission. Thus, in addition to its main function of mode selection, the DPH mode reorganizer 130*a* accomplishes the function of a partially reflecting mirror.

In addition to the above, the DPH mode reorganizer 130*a* participates in bouncing of the light beam back and forth and in aforementioned reorganization of the modes by suppressing the side modes and gaining the low-order modes, or mode. As a result, output radiation acquires coherency and increased brightness due to decrease of the spatial divergence.

Figure 1C:
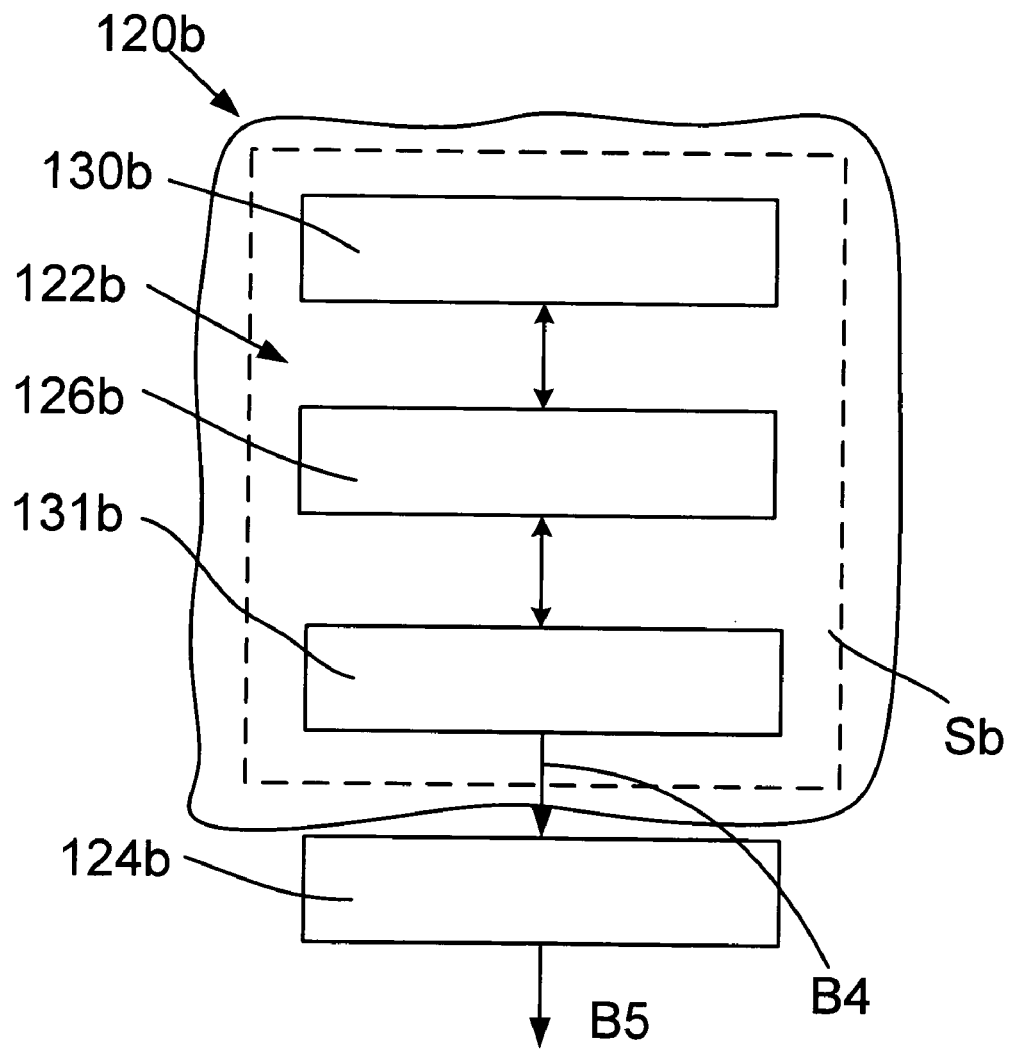

Alternatively, as shown in FIG. 1C, the coherent-beam system 120*b* of the invention can be embodied so that the DPH mode reorganizer 130*b* accomplishes the function of a fully reflecting mirror. In general, this system is the same as that shown in FIG. 1B but differs from system 120*a* in that this system includes the partially transparent mirror 131*b* located between the lasing medium 126*b* and the DPH mode reorganizer 130*b*, and the DPH mode reorganizer 130*b* is used instead of the fully reflecting mirror 130*a*. Other components of the system 120*c*, which are similar to the components of the system 120*b* and accomplish the same functions, are designated by the same reference numerals but are accompanied by addition of the letter "b" instead of the letter "a". The beam B4 sent from the emitter of the lasing medium 126*b* is sent to a collimation optics 124*b* that emits an output beam B5 of improved brightness. The symbol Sb designates a submount. In the system 120*b*, the DPH mode reorganizer 130*b*, the optically active medium 126*b*, and the partially transparent mirror 131*b* form the optical resonator 122*b* wherein the DPH mode reorganizer functions as a fully reflecting mirror and is located at the closed end of the resonator, which does not pass the optical beam.

In operation, the multimode beam propagates back and forth through the active optical medium 126*b* between the DPH mode reorganizer 130*b* and the partially transparent mirror 131*b*. In this process, the modes are reorganized, with suppression of the high-order modes and enhancement of the low-order modes.

In both systems 120*a* and 120*b*, each DPH mode reorganizer 130*a* and 130*b*, respectively, has a complicated hierarchical structure, which in approximation can be considered substantially as a supergrating consisting of standard binary nanofeatures (for example, etched grooves of a rectangular shape) formed in a planar waveguide in order to modulate its effective refractive index. Each binary nanofeature is defined by three dimensions: width, length, and depth. The width and depth of these nanofeatures are shorter than the laser wavelength of radiation interacting with the aforementioned grooves.

As a light beam is confined inside the planar waveguide, it is forced to propagate through and optically interact with the DPH structure, which results in mode reorganization with the aforementioned reorganizing that leads to suppression of the high-order modes and hence increase in brightness of the output beam emitted from the system.

As mentioned above, all optical components in systems 120*a* and 120*b* are implemented as integrated devices in the form of planar optical chips. Optionally, there can be one planar chip for the laser active media 126*a* and 126*b* and the DPH mode reorganizers 130*a* and 131*b* together, or two planar chips, i.e., one for the laser media and another for the DPH mode reorganizers. In the second case, both chips are optically coupled with each other.

According to the present invention, each DPH mode reorganizer is implemented as a combination of holographic elements, e.g., nanogrooves embedded into a planar waveguide for periodical modulation of its refractive index. The modulating function is calculated based on optical-transfer functions, desirable in said reorganizer and implemented by standard mass-production methods such as nanolithography or nanoimprinting. Numerous nanofeatures (e.g., in an amount of $10^5$-$10^6$) can be aggregated into multiple subgratings, each of which is responsible for an optical-transfer function.

Each subgrating is a group of DPH features specifically selected to accomplish a predetermined function from multiple functions of the DPH mode reorganizer. All subgratings are superimposed on the same planar area, forming a supergrating that performs all desired functions.

Each supergrating is generated as a mathematical superposition of elliptic, parabolic, or hyperbolic subgratings, with a spatial period of an approximate one-half wavelength according to the following method. The first to be created is a two-dimensional analog-generating function A(x,y) representing a superposition of modulation profiles of the refractive index. Each modulation function corresponds to the equivalent of a subgrating. Determined in this step is a two-dimensional-generating function A(x,y) that resembles the profile of a refractive index in a planar waveguide corresponding to desired optical transfer functions to be implemented.

The next step is binarization of the two-dimensional analog-generating function A(x,y), which was produced in the previous step. Binarization is achieved by applying a threshold value and assigning 1 to all areas above the predetermined threshold and 0 to the remaining areas in order to obtain a digital, two-dimensional-generating function B(x,y).

Next, the complex shape islands in B(x,y) with the value of 1 are simplified for presentation as a combination of standard microlithographic or nanolithographic features (short and straight grooves). This is accompanied by conversion to function C(x,y).

The last step is lithographic fabrication of the standard nanofeatures by microlithography or nanoimprinting as function C(x, y) to a calculated depth on a planar waveguide.

An example of the structure of a mode-reorganizing system according to the invention is shown in FIGS. 2A to 2F. For clarity, each drawing illustrates interaction of the selected modes of the laser with respective subgratings, which, in reality, are combined into a single supergrating. In other words, in each respective drawing, the illustrated system, which as a whole is designated by reference numeral 200a, consists of a multimode laser 220 and respective subgratings selected from subgratings 222a through 222f.

The lasing medium of a multimode laser 220 emits a multimode beam 221 that has a complicated structure consisting of several modes. The output beam can be presented as a combination of subbeams radiated by narrow, active regions or (that form the lasing medium). The width of these regions is selected so that the subbeam from each region is a single-mode beam.

The subbeams 220a and 220b of the multimode beam 221 propagate to the supergrating and are reflected by subgrating 222a in a planar waveguide so that the corresponding regions or subvolumes 1a and 2b of the active medium are intercoupled (FIG. 2A). As a result, the subvolumes emit single-mode beams which would not be of the same mode if they were not intercoupled, but intercoupling forces them to generate the same mode of radiation. Ideally, the output beam will have the same parameters as from one single-mode region, but its power will be doubled. Accordingly, the brightness of the combined intercoupled beam is also doubled. In reality, it will not be a factor of two because of inevitable losses associated with intercoupling, but the enhancement factor will be close to 2 because the losses can be minimized by using a high-transparency waveguide and low-loss butt-coupling.

As known, a single-mode laser resonator should satisfy the following condition:

$$a^2/(\lambda*L)<1, \quad (1)$$

where a is the laser aperture, $\lambda$ is radiation wavelength (inside the resonator), and L is the resonator length.

In accordance with formula (1), the size of the single-mode region in the wide-aperture laser diode can be calculated. The total number of single-mode regions N can be estimated as:

$$N=A/a, \quad (2)$$

where A is the width of a wide-aperture active medium, and $$a<(\lambda*L)^{0.5} \quad (3)$$

For typical values of parameters a and A, the number of single-mode subregions ranges from N~3÷30. Parameter N determines the number of subgratings to be superimposed to form the supergrating.

Figure 2F:
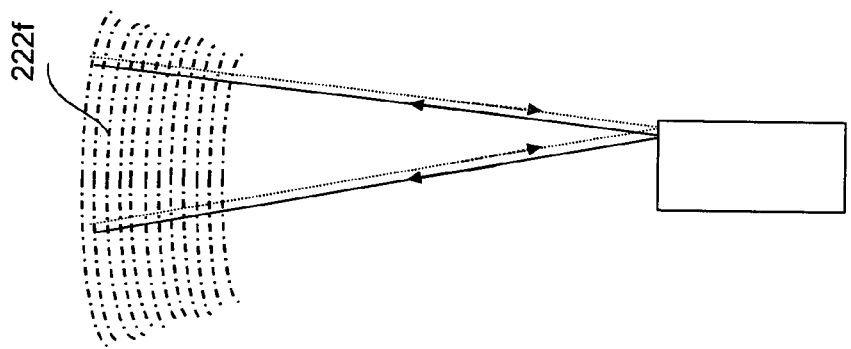
Figure 2E:
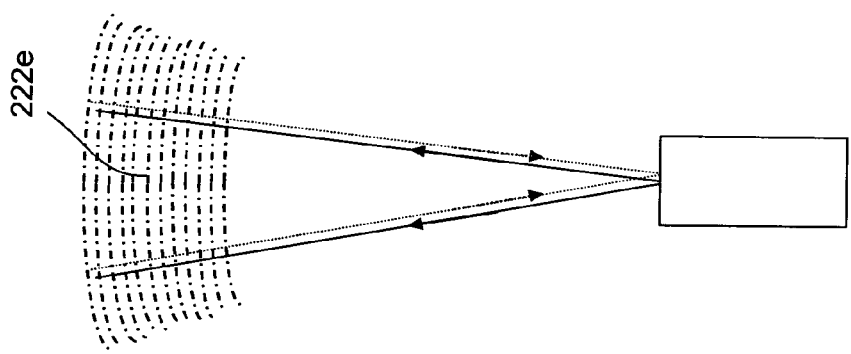
Figure 2D:
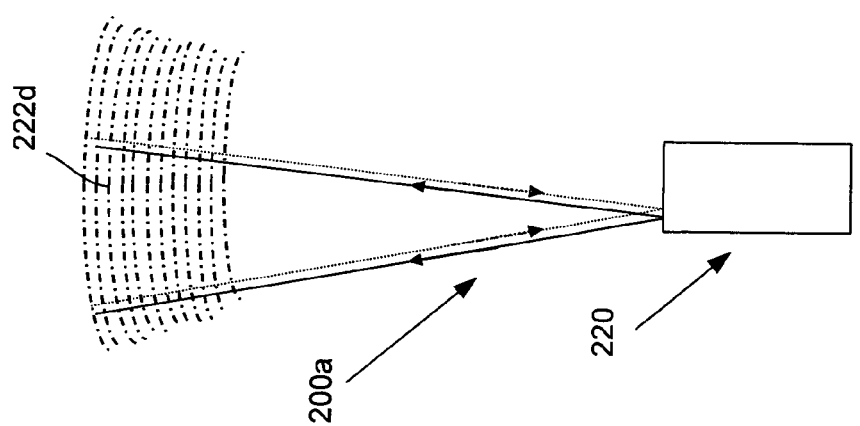

Consider, for example, an imaginary laser that radiates a three-mode beam, wherein each mode corresponds to a subbeam. FIGS. 2A, 2B, 2C, 2D, 2E, and 2F illustrate operation of a system that contains a grating consisting of six subgrating 222a, 222b, 222c, 222d, 222e and 222f, respectively, shown in separate drawings. In FIG. 2A, the subbeam 220a corresponds to a region 1a, and the subbeam 220b corresponds to a region 2b. For simplicity in the drawings, designations of subbeams in FIGS. 2B, 2C, 2D, 2E, and 2F are omitted but are shown in Table 1, which lists the intercoupling of subbeams with each other in the resonator (not shown in FIGS. 2A to 2F)

TABLE 1

| Subbeams Intercoupled by Corresponding Subgratings | | | |
|---|---|---|---|
| subgrating | 222a | intercouples subbeams | 220a and 220b |
| | 222b | | 220a and 220c |
| | 222c | | 220b and 220c |
| | 222d | | 220a to itself |
| | 222e | | 220b to itself |
| | 222f | | 220c to itself |

Figure 2G:
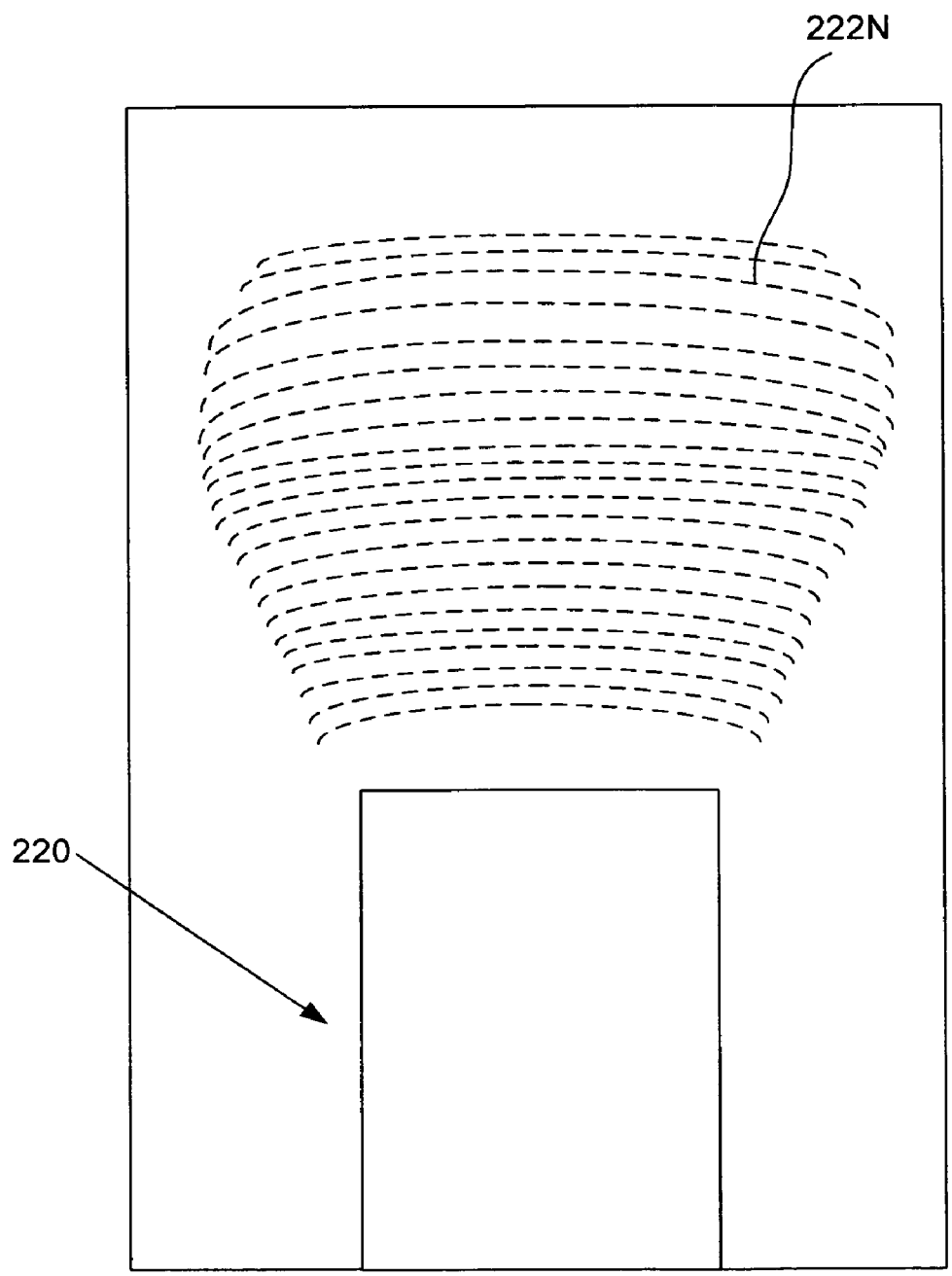
FIG. 2G is a simplified top view of the system of the invention that shows a lasing medium and a supergrating composed of subgratings of the types shown in FIG. 2A through FIG. 2F.

All subgratings are superimposed on the same planar area, forming a supergrating, where each feature works toward the best synergistic performance of all desired functions. In general, for the structure shown in FIG. 2G with supergrating 222N and N single-mode regions, generating single-mode subbeams 220a', 200b', and 220c' through 220n', the required number of subgratings can be calculated in the following way:

subbeam 220a' needs to be coupled with N modes (including itself), subbeam 220b' needs to be coupled with N−1 modes because it has already been coupled with mode 220a', subbeam 220c' needs to be coupled with N−2 modes because it has already been coupled with modes 220a', 220b', and so on;

finally, subbeam 220n' needs to be coupled with itself only because it has already been coupled with all other subbeams.

Therefore, the total number of subgratings m is the sum of the arithmetic progression:

$$m=N+(N-1)+(N-2)+\ldots+1, \quad (4)$$

i.e., $$m=0.5N(N+1) \quad (5)$$

As mentioned, a DPH mode reorganizer can be used as a fully reflecting resonator mirror or as a partially reflecting mirror. Such modifications can be provided by varying the length of the DPH mode reorganizer; short supergratings reflect only partially, and the reflection coefficient grows with structure length and after becoming saturated does not depend on additional increase in length, i.e., forms a fully reflecting component.

As follows from the above formula (5), the number of subgratings grows in arithmetic progression with increase in the size of the laser aperture.

Figure 3:
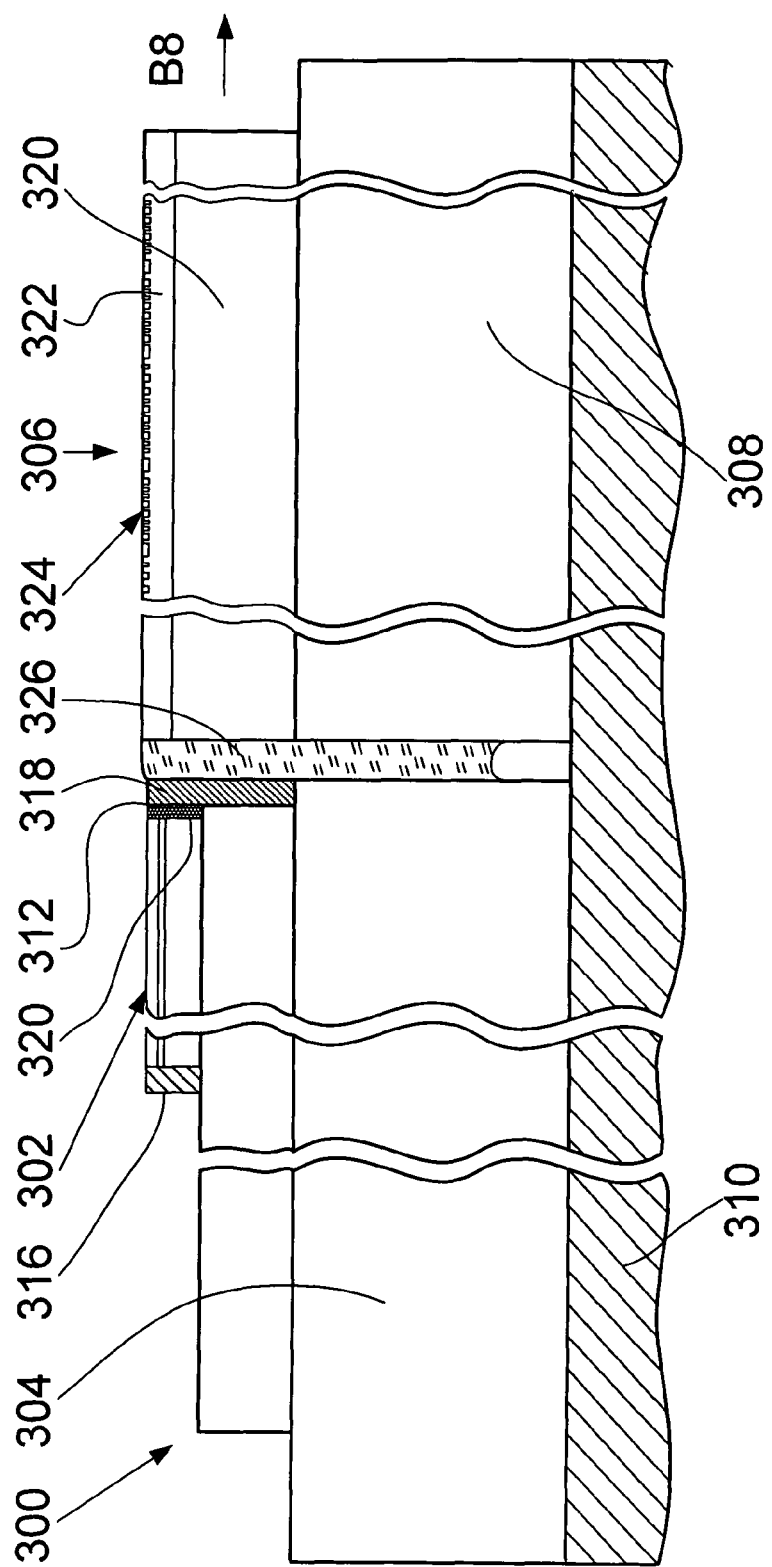
FIG. 3 is a side sectional view of a light-enhancing device according to one aspect of the invention, wherein the DPH mode reorganizer is used as a partially transparent mirror.
Figure 4:
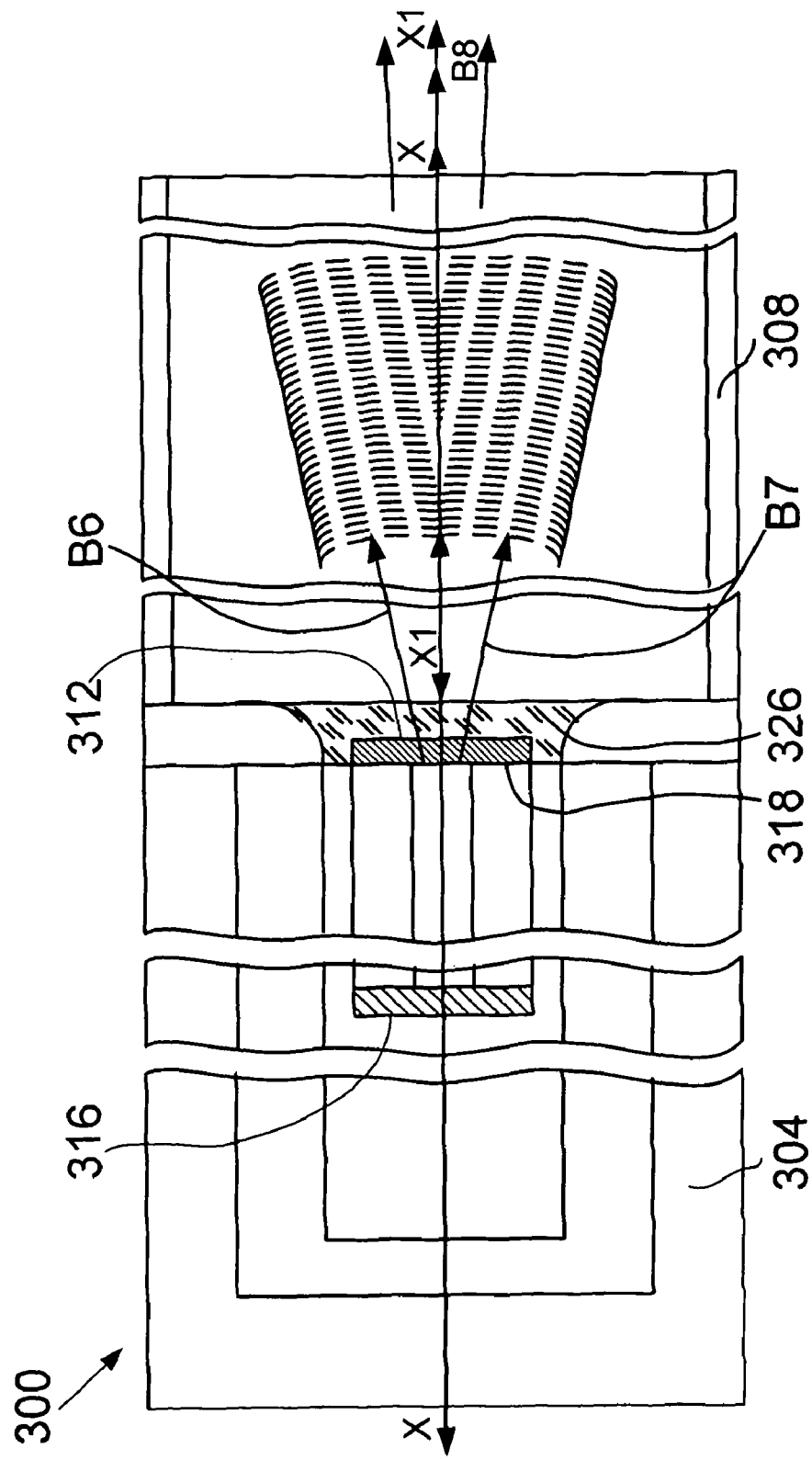
FIG. 4 is a top view of the device shown in FIG. 3.

FIG. 3 is a sectional view of a light-enhancing device of the invention, which, as a whole, is designated by reference numeral 300. FIG. 4 is a top view of the device shown in FIG. 3. The device 300 comprises a lasing medium 302 installed on a substrate submount 304 made of, e.g., silicon, and a specific DPH mode reorganizer 306, which is formed on a silicon substrate 308 according to specific application of the device. Both units 302 and 306 are supported by a mounting plate 310 that also can be made of a suitable material of high thermal conductivity, such as ceramic.

In combination with mirrors, as described below, the lasing medium 302 radiates a multimode light beam and has a relatively wide emitter 312 with a width ranging from about 10 microns to several hundred microns. The height of the emitter ranges from about 0.2 nm to several microns. The active lasing medium 302 (FIG. 4) is limited on one side with a fully reflective mirror 316 and on the other side with an antireflective coating 318 having a very low coefficient of reflection (R<0.1%).

The DPH mode reorganizer 306 is supported by a silicon substrate 308 and comprises (1) a lower cladding layer 320 (e.g., of $SiO_2$) that rests on the silicon substrate 308 and has a thickness in the range of several to several tens of microns, and (2) a core 322 that is placed onto the lower cladding, which is made of $SiO_2$ doped with a material such as germanium which changes the refraction index by 1 to 5%, and has a thickness of about several nanometers to one micron or is doped with any other transparent material having a refractive index greater than that of the cladding (FIG. 3). If necessary, an upper cladding with a refractive index lower than that of the core can be placed onto the core 322.

The core 322 of the DPH mode reorganizer 306 comprises a plurality of holographic elements, hereinafter referred to as "elements," in the form of grooves 324 with a depth of less than the thickness of the core. Preferably, the elements are rectangular grooves produced as binary nanofeatures suitable for reproduction by methods of nanolithography or nanoimprinting.

The number of such elements can exceed $10^6$. The total surface area occupied by these elements on the surface of the core is several $mm^2$. An example of this pattern of elements is shown in FIG. 4. The elements, or grooves 324, locally change the refractive indices of the core. If the dimensions of the elements do not exceed the dimensions of the wavelength, the density of the elements on the core surface can be used to control the density of the light beam. This means that the light beam B5, B6, and B7 (FIG. 4) that enters the DPH mode reorganizer 306 from the lasing medium 302 and is processed by the DPH mode reorganizer 306 is converted into a beam B8 having desired parameters defined by the specific application of the device 300 as a whole.

As mentioned above, the lasing medium 302 and the DPH mode reorganizer 306 are both mounted on a common base plate 310 made of, e.g., Si, $SiO_2$, or quartz. To stabilize temperature in laser media of high power, the common base plate 310 can be made from a material of high thermal conductivity on a thermoelectric cooler. The lasing medium 302 and the DPH mode reorganizer 306 are mounted on the base plate 310 so that the optical axis X-X of the lasing medium 302 is aligned with the optical axis of the core and the respective axis of the hologram, e.g., the symmetry axis X1-X1. The light beams, B6, and B7 enter the DPH mode reorganizer 306 from the lasing medium 302 through an optical glue or an optical gel layer 326 with a refractive index close to that of the core 322.

In a conventional lasing medium having the above-described geometry with a fully reflecting mirror and a partially (10%) reflecting mirror instead of the above-described DPH mode reorganizer 306, the output beam B1 (FIG. 1A) will have several tens or even hundreds of different modes that have different intensities. Only some of these modes, e.g., several to ten modes will have approximately the same intensity. Therefore, in the far field, the beams B1 emitted by the laser, such as the laser diode 22a in FIG. 1A, will have significant divergence in the direction of the slow axis and wide distribution of radiation consisting of a large number of different modes. On the other hand, divergence in the direction of the fast axis may reach even several tens of degrees or more.

Figure 5:
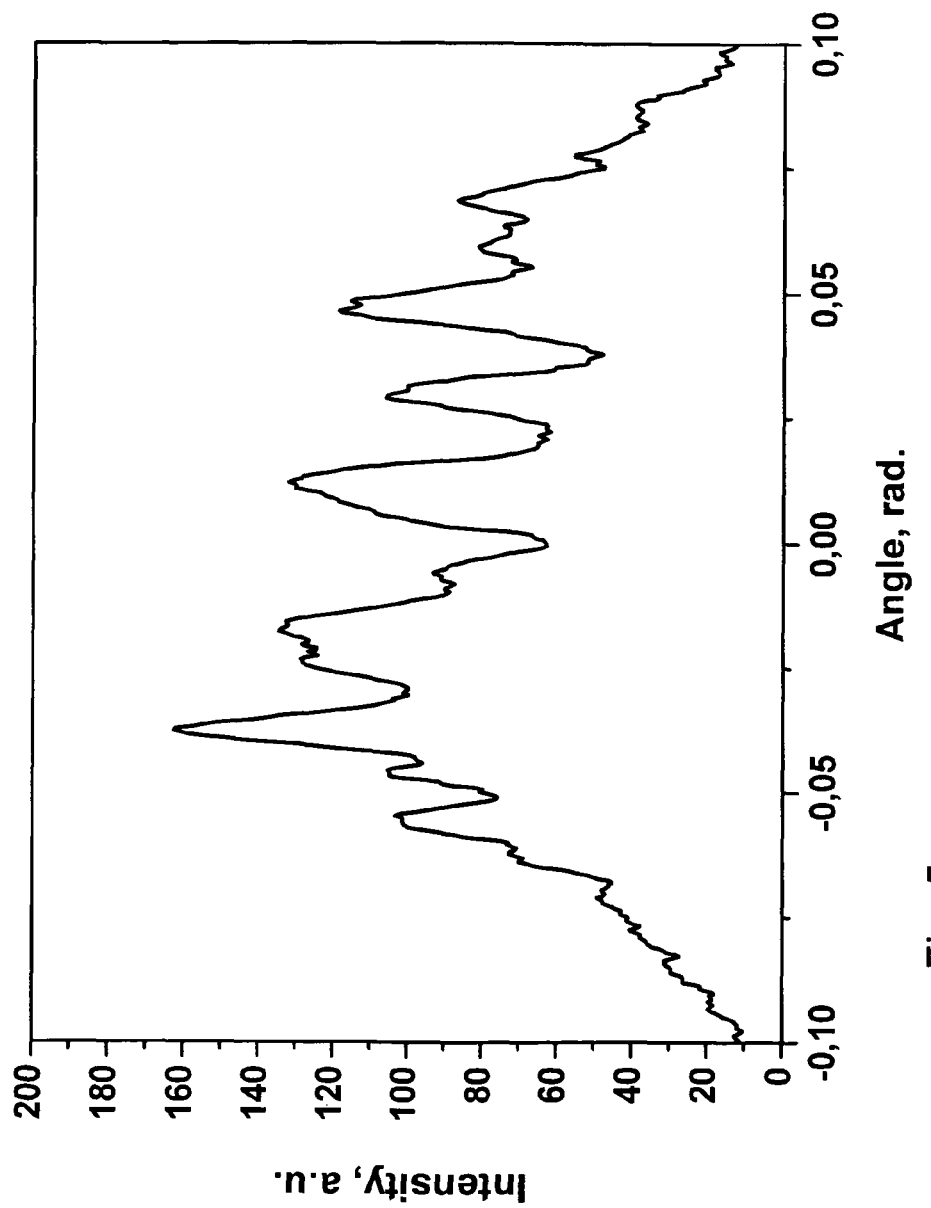
FIG. 5 is a graph illustrating angular dependence of light-intensity distribution in the far field for the conventional system shown in FIG. 1.
Figure 6:
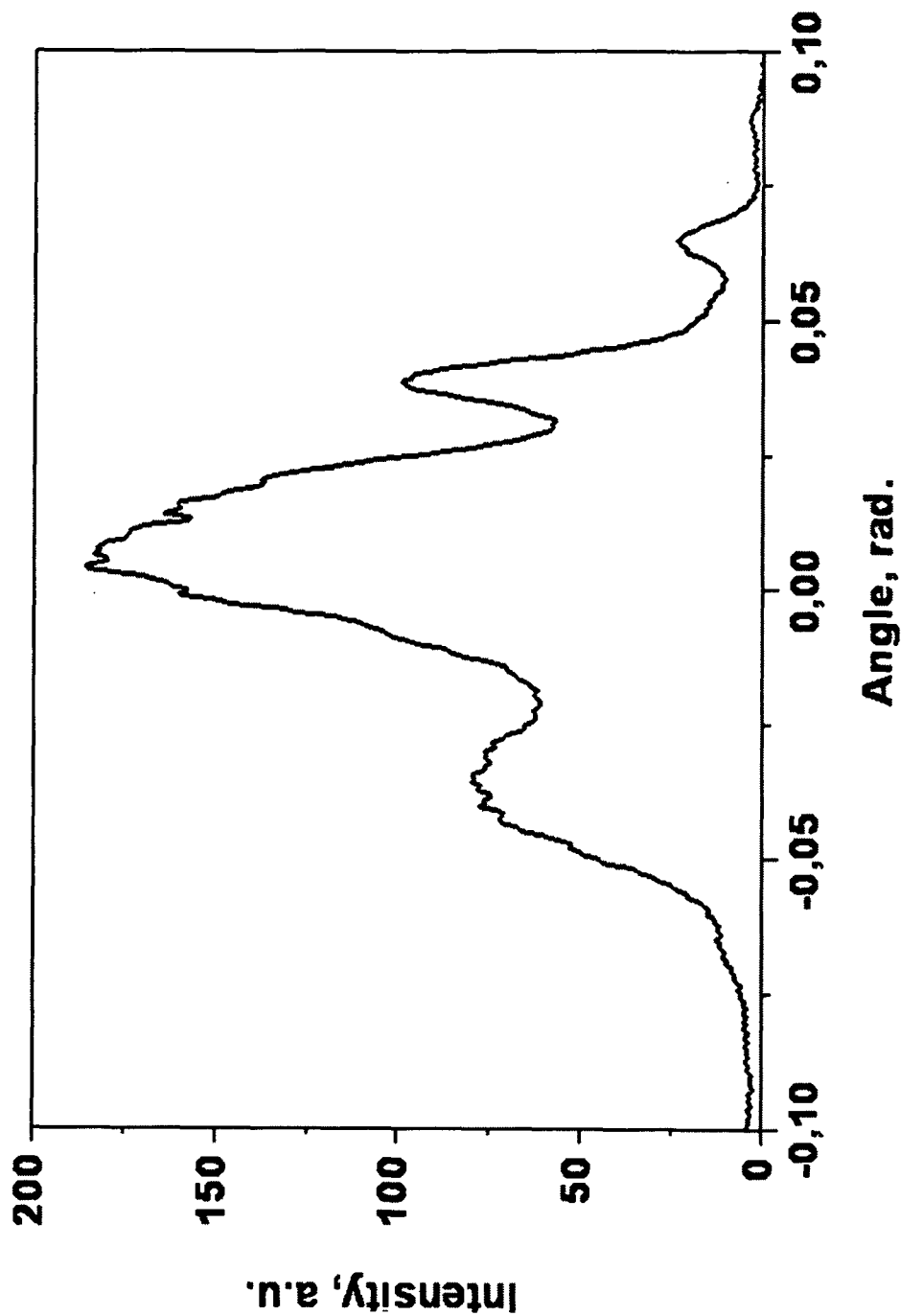
FIG. 6 is a graph illustrating angular dependence of light-intensity distribution in the far field for the system of the invention (shown in FIGS. 3 and 4), which incorporates the DPH mode reorganizer.

The situation dramatically changes when the partially (10%) reflecting mirror or the fully reflecting mirror is replaced with the specific DPH mode reorganizer 130a of the invention, as described above. This situation occurs because the DPH mode reorganizer 130a converts the multimode beam into a beam with far fewer space modes. This is shown in FIGS. 5 and 6, which illustrate the angular dependence of light-intensity distribution in the far field. FIG. 5 corresponds to the system of FIG. 1A, and FIG. 6 corresponds to the system of FIGS. 3 and 4 for the same lasing medium as in FIG. 1A but in combination with the DPH mode reorganizer 130a of the invention.

The proposed invention was experimentally tested with a wide-aperture laser diode, as described below.

The radiation field of the wide-aperture laser diode 22a in the far-field region is shown in FIG. 5. It has a multimode structure with 8 to 10 modes having an angular divergence of about 20° in the direction of the slow axis.

On the other hand, it can be seen from FIG. 6 that coupling with the DPH mode reorganizer 130a (FIGS. 1B, 3, and 4) dramatically changes the structure of the output beam; a powerful low-order mode is formed, and the major part of the output light power of the laser is concentrated in this low-order mode, while a much smaller part of laser power is held by two side modes. Therefore, the total number of modes is significantly reduced to three and can be even further reduced to a single-mode structure after refining the design of the DPH mode reorganizer. For the system of the invention, such mode-distribution pattern is typical for the far field. Angular divergence in the direction of the slow axis is reduced four-fold, i.e., from about 20° to about 5°.

It was unexpectedly discovered that divergence in the direction of the fast axis was also reduced, in this case by a factor of 4, i.e., from about 40° to about 10°. It was also discovered that the beams B6 and B7 (FIG. 4) that were collimated in the core 322 during propagation through and interaction with the DPH mode reorganizer 306 was then transferred to the lower cladding 320 where it was sent from the system 300 as beam B8, which possesses the above-mentioned characteristics.

Figure 7:
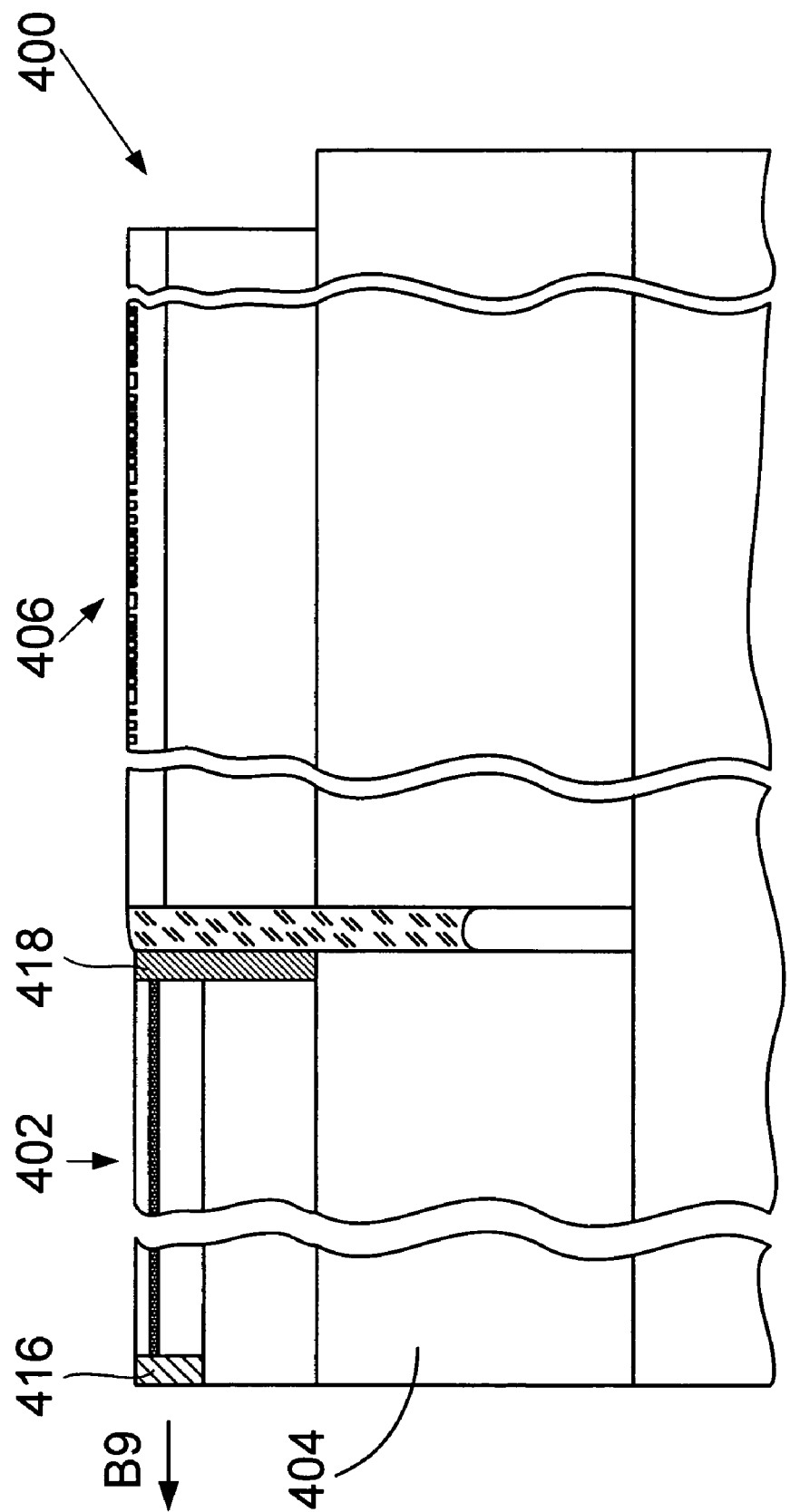
FIG. 7 is a side sectional view of the light-enhancing device according to another aspect of the invention, wherein the DPH mode reorganizer is used as a fully reflecting mirror.

FIG. 7 is a sectional view of a light-enhancing device according to another aspect of the invention. The device, as a whole, is designated by reference numeral 400. In general, the device shown in FIG. 7 is similar to the device 300 shown in FIG. 3 except that a specific DPH mode reorganizer 406 is configured as a fully reflective mirror, while a partially reflecting mirror 416 functions as an emitter of the lasing medium 402, which is supported by a submount 404. An antireflective coating 418 is placed between the DPH mode reorganizer 406 and the lasing medium 402. The lasing medium 402, the DPH mode reorganizer 406, and the partially reflecting mirror 416 form a resonator.

During operation of the device 400, the light emitted from the lasing medium 402 bounces back and forth in the resonator between the partially reflecting mirror 416 of the lasing medium 402 and the DPH mode reorganizer 406, which is configured as a fully reflecting mirror with the function of gaining the low-order modes, or mode, by suppressing the side modes, thus increasing brightness of the light beam B9 emitted from the system.

The light-enhancing method of the invention comprises the following steps:

providing an optical system comprising a lasing medium that radiates multiple modes, has at least one cladding and a core, said core having a thickness, a DPH mode reorganizer with a plurality of holographic elements in the form of grooves having less depth of thickness than that of the core and smaller dimensions than those of the wavelength of light emitted by the lasing medium, the elements being arranged in a pattern that accomplishes a given function and changes the refractive index of the core; and a mirror selected from a fully reflecting mirror and a partially reflecting mirror; said multiple modes comprising essentially at least one low-order mode and a plurality of side modes;

forming a resonator from the lasing medium, the DPH reorganizer, and the mirror selected from a fully reflecting mirror and a partially reflecting mirror;

bouncing the light emitted from the lasing medium back and forth in the resonator, and reorganizing the modes by using the given function for gaining said low-order mode by suppressing the side modes, thus decreasing beam divergence and increasing brightness of the light emitted from the system.

Although the invention has been shown and described with reference to specific embodiments, these embodiments should not be construed as limiting the areas of application of the invention and any changes and modifications are possible provided that these changes and modifications do not depart from the scope of the attached patent claims. For example, the system cannot contain mirrors but instead can contain two DPH beam combiners functioning as the respective mirrors. Replacement of all mirrors with the DPH structures of this invention applies to all combinations of the system examples described above.

The invention claimed is:

1. The light-enhancing method of the invention comprising the following steps:

providing an optical system that produces a mode-reorganized optical beam and comprises an output end from which the mode-reorganized optical beam is sent from the system; a wide-aperture lasing medium that radiates an optical beam having multiple modes, has at least one cladding and a core, said core having a thickness, and a DPH mode reorganizer with a plurality of nanofeatures in the form of holographic elements having less depth than the thickness of the core and smaller dimensions than the half-wavelength of light emitted by the lasing medium, the nanofeatures being arranged in a pattern that accomplishes a given function and locally changes the refractive index of the core; and a mirror selected from a fully reflecting mirror and a partially reflecting mirror; said multiple modes comprising essentially at least one low-order mode and a plurality of high-order modes;

forming a resonator from the lasing medium, the DPH reorganizer, and the mirror selected from a fully reflecting mirror and a partially reflecting mirror; and bouncing the light emitted from the lasing medium back and forth in the resonator and reorganizing the modes by using the given function for gaining said at least one low-order mode by suppressing the high-order modes, thus increasing brightness of the light emitted from the system.

2. The method of claim 1, further comprising the step of forming the grooves as straight grooves that can be produced as binary features by methods of nanolithography or nanoimprinting.

3. The method of claim 2, wherein the DPH mode reorganizer is used as a fully reflecting mirror and is located at the closed end of the optical system, which does not pass the optical beam.

4. The method of claim 2, wherein the DPH mode reorganizer is used as a partially reflecting mirror and is located in an intermediate position or at the output end of the optical system.

5. The method of claim 1, further comprising the step of using said at least one cladding as a lower cladding and using the lower cladding for propagating the mode-reorganized optical beam to the output end of the optical system.

6. An optical system that produces a mode-reorganized optical beam, the optical system comprising:

an output end through which a mode-reorganized optical beam is sent from the system;

an optically active lasing medium that radiates an optical beam having multiple modes, has at least one cladding and a core, said core having a thickness;

a DPH mode reorganizer with a plurality of nanofeatures in the form of holographic elements having less depth than the thickness of the core and smaller dimensions than the half-wavelength of light emitted by the lasing medium, the elements being arranged in a pattern that accomplishes a given function and locally changes the refractive index of the core; and a mirror selected from a fully reflecting mirror and a partially reflecting mirror; said multiple modes comprising essentially at least one low-order mode and a plurality of high-order modes, the optically active lasing medium, the DPH mode reorganizer, and one of the mirrors selected from a fully reflecting mirror and a partially reflecting mirror forming an optical resonator, which has a closed end that does not pass the optical beam, in said resonator the light emitted from the lasing medium being bounced back and forth and the given function being a function of gaining said at least one low-order mode by suppressing the high-order modes, thus increasing brightness of the light emitted from the system.

7. The optical system of claim 6, wherein the resonator has a closed end and wherein the DPH mode reorganizer comprises the fully reflecting mirror installed at the closed end of the resonator.

8. The optical system of claim 6, wherein the DPH mode reorganizer comprises a partially reflecting mirror installed at the output end of the system.

9. The optical system of claim 6, wherein said at least one cladding is a lower cladding that receives the optical beam from the core of the lasing medium and through which the mode-reorganized beam propagates to the output end of the system.

10. The optical system of claim 9, wherein the resonator has a closed end and wherein the DPH mode reorganizer comprises the fully reflecting mirror installed at the closed end of the resonator.

11. The optical system of claim 9, wherein the DPH mode reorganizer comprises a partially reflecting mirror installed at the output end of the system.

12. The optical system of claim 11, wherein the holographic elements are grooves.

13. The optical system of claim 12, wherein the grooves are rectangular for use as binary features reproduced by methods of nanolithography or nanoimprinting.

14. An optical system that produces a mode-reorganized optical beam, the optical system comprising:
　an output end through which a mode-reorganized optical beam is sent from the system;
　a laser diode comprising an optically active lasing medium that radiates an optical beam having multiple modes comprising essentially at least one low-order mode and a plurality of high-order modes, has at least one cladding and a core, said core having a thickness, and at least one mirror selected from a fully reflecting mirror and a partially reflecting mirror; and
　a DPH mode reorganizer with a plurality of holographic elements having less depth than the thickness of the core and smaller dimensions than those of the half-wavelength of light emitted by the lasing medium, the elements being arranged in a pattern that accomplishes a given function and changes the refractive index of the core, said DPH mode reorganizer comprising said at least one mirror, in said resonator the light emitted from the lasing medium being bounced back and forth and the given function being a function of gaining said at least one low-order mode by suppressing the high-order modes, thus increasing brightness of the light emitted from the system.

15. The optical system of claim 14, wherein said multiple modes comprising essentially at least one low-order mode and a plurality of high-order modes, the optically active lasing medium, and the DPH mode reorganizer forming an optical resonator that has a closed end, which does not pass the optical beam; and
　the given function being a function of gaining said at least one low-order mode by suppressing the high-order modes, thus increasing brightness of the light emitted from the system.

16. The optical system of claim 15, wherein the resonator has a closed end and wherein the DPH mode reorganizer comprises the fully reflecting mirror installed at the closed end of the resonator.

17. The optical system of claim 14, wherein the DPH mode reorganizer comprises a partially reflecting mirror installed at the output end of the system.

18. The optical system of claim 14, wherein said at least one cladding is a lower cladding that receives the optical beam from the core of the lasing medium and through which the mode-reorganized beam propagates to the output end of the system.

19. The optical system of claim 18, wherein the resonator has a closed end and wherein the DPH mode reorganizer comprises the fully reflecting mirror installed at the closed end of the resonator.

20. The optical system of claim 18, wherein the DPH mode reorganizer comprises a partially reflecting mirror installed at the output end of the system.

\* \* \* \* \*